(12) United States Patent
Kameko et al.

(10) Patent No.: US 10,564,188 B2
(45) Date of Patent: Feb. 18, 2020

(54) CURRENT SENSING DEVICE AND METHOD FOR PRODUCING THE SAME

(71) Applicant: KOA CORPORATION, Ina-shi, Nagano (JP)

(72) Inventors: Kenji Kameko, Nagano (JP); Kosuke Arai, Nagano (JP)

(73) Assignee: KOA CORPORATION, Nagano (JP)

(*) Notice: Subject to any disclaimer, the term of this patent is extended or adjusted under 35 U.S.C. 154(b) by 63 days.

(21) Appl. No.: 15/739,022

(22) PCT Filed: Jun. 14, 2016

(86) PCT No.: PCT/JP2016/067631
§ 371 (c)(1),
(2) Date: Dec. 21, 2017

(87) PCT Pub. No.: WO2016/208453
PCT Pub. Date: Dec. 29, 2016

(65) Prior Publication Data
US 2018/0188295 A1     Jul. 5, 2018

(30) Foreign Application Priority Data
Jun. 22, 2015 (JP) .................................. 2015-124619

(51) Int. Cl.
*G01R 1/06* (2006.01)
*G01R 19/00* (2006.01)
(Continued)

(52) U.S. Cl.
CPC ......... *G01R 19/0092* (2013.01); *G01R 1/067* (2013.01); *G01R 1/06788* (2013.01);
(Continued)

(58) Field of Classification Search
CPC . H01L 2924/00014; H01L 2224/73204; H01L 2224/16225; H01L 2224/32225;
(Continued)

(56) References Cited

U.S. PATENT DOCUMENTS

2007/0243760 A1*  10/2007  Fujita ................. G01N 27/4071
                                                                    439/585
2008/0054744 A1    3/2008  Fornoff et al.
(Continued)

FOREIGN PATENT DOCUMENTS

JP      59-127218 U    8/1984
JP      S59-127218 U   8/1984
(Continued)

OTHER PUBLICATIONS

JP 2011003694 Machine Translation, dated Jan. 6, 2011 (Year: 2011).*
(Continued)

*Primary Examiner* — Raul J Rios Russo
(74) *Attorney, Agent, or Firm* — Brinks Gilson & Lione

(57) ABSTRACT

Provided is a current sensing device including an electrical conductor made of electrically conductive metal; and voltage sensing terminals provided on the electrical conductor. Each voltage sensing terminal is formed by inserting bar-like metal into a through-hole formed in the electrical conductor, and the voltage sensing terminal includes a first terminal portion that is stored in the through-hole and a second terminal portion that protrudes from the through-hole.

4 Claims, 17 Drawing Sheets

(51) Int. Cl.
    *G01R 1/067*     (2006.01)
    *G01R 3/00*     (2006.01)
    *G01R 19/155*     (2006.01)
    *G01R 31/382*     (2019.01)

(52) U.S. Cl.
    CPC ............ *G01R 3/00* (2013.01); *G01R 19/155* (2013.01); *G01R 31/382* (2019.01); *H01L 2224/16225* (2013.01); *H01L 2224/32225* (2013.01); *H01L 2224/73204* (2013.01); *H01L 2924/00014* (2013.01)

(58) Field of Classification Search
    CPC ...... G01R 1/06788; G01R 3/00; G01R 1/067; G01R 19/155
    USPC ............ 324/72, 72.5, 76.11–76.83, 119, 149
    See application file for complete search history.

(56) References Cited

U.S. PATENT DOCUMENTS

| | | |
|---|---|---|
| 2012/0154104 A1 | 6/2012 | Hetzler |
| 2012/0244746 A1* | 9/2012 | Tsuge .................. H01R 13/631 439/571 |
| 2015/0212115 A1 | 6/2015 | Nakamura et al. |
| 2017/0030946 A1* | 2/2017 | Gravermann .......... G01R 15/16 |
| 2017/0307658 A1* | 10/2017 | Chiku ..................... G01R 1/203 |
| 2018/0172735 A1* | 6/2018 | Arai ....................... G01R 15/00 |

FOREIGN PATENT DOCUMENTS

| | | |
|---|---|---|
| JP | H04-94101 A | 3/1992 |
| JP | H06-151035 A | 5/1994 |
| JP | 2007-538210 A | 12/2007 |
| JP | 2009-244065 A | 10/2009 |
| JP | 2011-003694 A | 1/2011 |
| JP | 2012531760 A | 12/2012 |
| JP | 2014-53437 A | 3/2014 |

OTHER PUBLICATIONS

International Search Report in corresponding International Application No. PCT/JP2016/067631, dated Aug. 2, 2016, 5 pages.

Office Action in Japan Application No. 2015-124619, dated May 8, 2019, including partial English Translation, 6 pages.

Office Action in Japan Application No. 2015-124619, dated Aug. 6, 2019, 5 pages.

* cited by examiner

CURRENT SENSING DEVICE AND METHOD FOR PRODUCING THE SAME

This application is a 371 application of PCT/JP2016/067631 having an international filing date of Jun. 14, 2016, which claims priority to JP2015-124619 filed Jun. 22, 2015, the entire contents of each of which are incorporated herein by reference.

TECHNICAL FIELD

The present invention relates to a current sensing device and a method for producing the same.

BACKGROUND ART

As a technique for detecting current of batteries of automobiles and the like, a shunt-based current sensing method that uses a metal plate resistor is used. This method is also called four-terminal measurement and is a high-accuracy current sensing method.

Factors for sensing current with high accuracy include the types of resistive materials used, the shapes and structures of resistors, and the like. Further, the current sensing accuracy is also influenced by the positional accuracy of voltage sensing terminals for sensing voltage. In particular, when the resistance value is less than or equal to 1 m$\Omega$, the current sensing accuracy is greatly influenced by the positions of voltage sensing terminals.

Patent Literature 1 discloses a technique of forming voltage sensing terminals through stamping and formation of screws. In addition, Patent Literature 2 discloses a technique of providing two plate-form base materials integrally formed with a resistive element and disposing measuring terminal portions on the respective base materials.

CITATION LIST

Patent Literature

Patent Literature 1: JP 2012-531760 A
Patent Literature 2: JP 2009-244065 A

SUMMARY OF INVENTION

Technical Problem

Patent Literature 1 discloses a structure for sensing voltage by means of fastening screws. However, there is a possibility the sensing accuracy may be influenced by tightening torque or loosening.

In addition, Patent Literature 2 discloses a technique of welding measuring terminal portions to the surfaces of base materials 12a, 12b, respectively, but it is difficult to maintain the positional accuracy. In addition, when such a structure obtained by joining measuring terminals and base materials together at their surfaces is used, high-accuracy sensing is difficult to perform unless the surfaces are joined uniformly, which is problematic.

It is an object of the present invention to maintain the positional accuracy high when voltage sensing terminals are formed.

Solution to Problem

According to an aspect of the present invention, there is provided a current sensing device including an electrical conductor made of electrically conductive metal; and voltage sensing terminals provided on the electrical conductor. Each voltage sensing terminal is formed by inserting bar-like metal into a through-hole formed in the electrical conductor, and the voltage sensing terminal includes a first terminal portion that is stored in the through-hole and a second terminal portion that protrudes beyond the through-hole.

Since the first terminal portion is stored in the through-hole, the current sensing terminal fits stably.

The voltage sensing terminal preferably includes a flange portion, and the flange portion preferably abuts the electrical conductor. The flange portion preferably includes two flange portions adapted to sandwich the electrical conductor therebetween. With the flange portion(s), the voltage sensing terminals are fixed firmly. At least an opening on one side of the through-hole preferably forms a recess portion with an increased inside diameter. The electrical conductor includes a resistive element and electrode terminals joined to the resistive element, and the voltage sensing terminals are provided on the respective electrode terminals.

The electrical conductor may include narrow portions, and the narrow portions may be provided between the voltage sensing terminals.

According to another aspect of the present invention, there is provided a method for producing a current sensing device, including preparing an electrical conductor; machining a part of the electrical conductor so as to form narrow portions and machining the electrical conductor so as to form a pair of through-holes in the respective narrow portions, and disposing voltage sensing terminals in an upright position in the respective through-holes.

Since machining of the electrical conductor in the width direction and machining of the electrical conductor to form through-holes therein are performed in the same step, and voltage sensing terminals are disposed in an upright position in the respective through-holes, the positional accuracy when the voltage sensing terminals are formed can be maintained high.

The present specification incorporates the disclosure of JP Patent Application No. 2015-124619 that forms the basis of the priority claim of the present application.

Advantageous Effects of Invention

According to the present invention, the positional accuracy when voltage sensing terminals are formed can be maintained high.

DESCRIPTION OF EMBODIMENTS

Hereinafter, a current sensing device in accordance with an embodiment of the present invention will be described in detail with reference to the drawings.

In this specification, "welding" refers to a joining method that includes applying heat, pressure, or both to joined portions of two or more members and also adding proper filler metal thereto as appropriate so as to form a single member of the integrated, continuous joined portions.

Hereinafter, a current sensing device in accordance with an embodiment of the present invention will be described in detail with reference to an example of a current sensing device that uses a resistor with a butt-joint structure in which end faces of a resistive element and end faces of electrodes are butt-joined together, respectively. It should be noted that such a technique can also be applied to a structure in which a resistive element and electrodes are connected together at their surfaces.

In this specification, a direction in which an electrode, a resistive element, and another electrode of a resistor are arranged is referred to as a length direction, and a direction that intersects the length direction is referred to as a width direction.

(First Embodiment)

Figure 1:
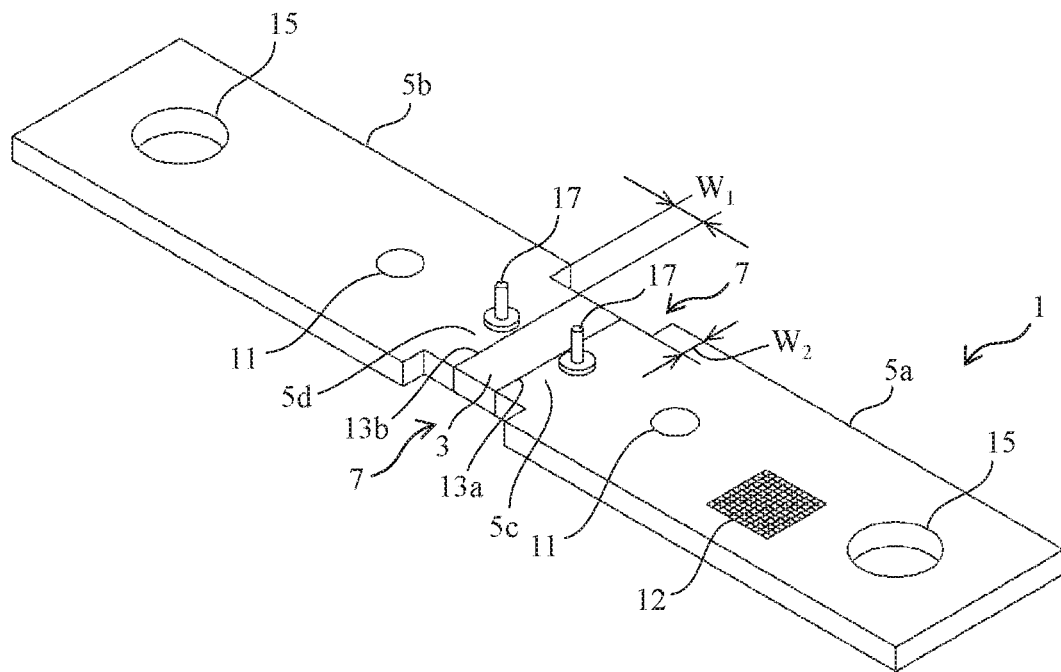
FIG. 1 is a perspective view showing an exemplary configuration of a current sensing device that uses a resistor in accordance with an embodiment of the present invention.

First, a current sensing device that uses a resistor in accordance with a first embodiment of the present invention will be described. FIG. 1 is a perspective view showing an exemplary configuration of a current sensing device that uses a resistor in accordance with this embodiment. A current sensing device 1 that uses a shunt resistor (hereinafter referred to as a "resistor") shown in FIG. 1 includes two electrodes 5a (first electrode), 5b (second electrode), a resistive element 3 disposed between the electrodes 5a, 5b, and voltage sensing terminals 17. It should be noted that a portion including the resistive element 3 and the electrodes 5a, 5b is also referred to as an electrical conductor. In addition, the electrodes 5a, 5b are also referred to as electrode terminals. The electrodes 5a, 5b include end-side main electrode portions (herein, portions excluding 5c, 5d of the electrodes 5a, 5b are defined as main electrode portions) and narrow electrode portions 5c, 5d that are located on the side of the resistive element 3 and have widths narrower than those of the main electrode portions by $2W_2$, respectively. The resistive element 3 is disposed between the narrow electrode portions 5c, 5d. It is assumed that the dimension of each of the narrow electrode portions 5c, 5d in the length direction is $W_1$. The dimension $W_1$ herein is about 1 to 3 mm, for example.

In this example, a single voltage sensing terminal 17 is provided on each of the narrow electrode portions 5c, 5d. When the voltage sensing terminals 17 are provided on the narrow electrode portions 5c, 5d, respectively, the distance between the voltage sensing terminals 17 can be shortened, and thus the current measurement accuracy in four-terminal measurement can be improved.

In the structure shown in FIG. 1, recess portions 7 are provided that are recessed inward in the width direction of a part of a region including the joined portions 13a, 13b, which have been formed by welding the resistive element 3 and the electrode portions 5a, 5b together, for example, so that narrow portions with narrow widths can be formed. In such a case, the width of each of the narrow electrode portions 5c, 5d is substantially equal to that of the resistive element 3. Portions that are formed by the recess portions 7 and thus are narrow are referred to as narrow portions (hereinafter the same).

According to the resistor in this embodiment, since the recess portions 7 are formed in a part of a region including the joined portions 13a, 13b of the resistive element 3 and the electrode portions 5a, 5b, it is possible to suppress concentration of stress generated across the shunt resistor on the joined portions 13a, 13b of the current sensing device 1.

Even when the recess portions 7 are formed to a length of about 1 to 3 mm ($W_1$) from the boundaries between the resistive element 3 and the electrodes 5a, 5b, a stress relaxation effect of greater than or equal to 10% is obtained. Further, providing the recess portions 7 can stabilize current distribution in a current path, and thus can improve the TCR characteristics.

It should be noted that in FIG. 1, reference numeral 15 denotes bolt holes. Reference numeral 11 denotes holes for fixing a current sensing substrate (which will be omitted hereinafter). In addition, reference numeral 17 denotes voltage sensing terminals that are provided on the narrow electrode portions 5c, 5d, respectively, in this example. When the voltage sensing terminals 17 are provided on the narrow electrode portions 5c, 5d, respectively, the distance between the voltage sensing terminals 17 can be shortened, and thus the current measurement accuracy in four-terminal measurement can be improved.

In addition, a code display portion 12 in which a code is displayed is formed on the upper face of the first electrode portion 5a, for example. The display of the code will be described later.

(Second Embodiment)

Next, a method for producing a current sensing device that uses a resistor in accordance with a second embodiment of the present invention will be described. As an example of a current sensing device that uses a resistor to be produced, the structure shown in FIG. 1 is used.

FIGS. 2 to 4 are views each showing a method for producing a current sensing device that uses a resistor in accordance with this embodiment, and showing a plan view and a cross-sectional view in pairs.

Figure 2A:
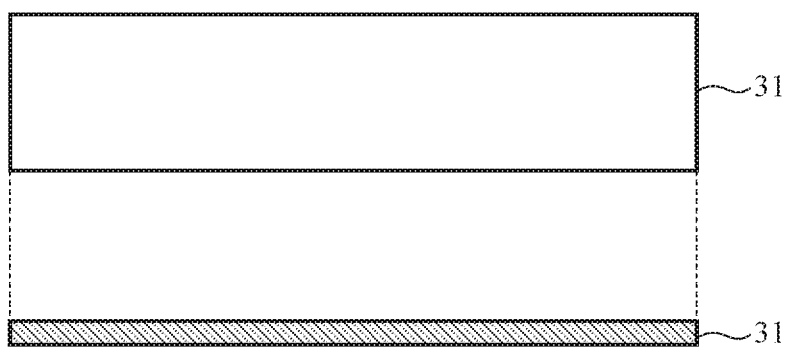
FIGS. 2A and 2B are views showing a method for producing a current sensing device that uses a resistor in accordance with a second embodiment of the present invention, and showing a plan view and a cross-sectional view in pairs.

As shown in FIG. 2A, first, an electrode material 31 with high electrical conductivity, such as Cu, is prepared.

Figure 2B:
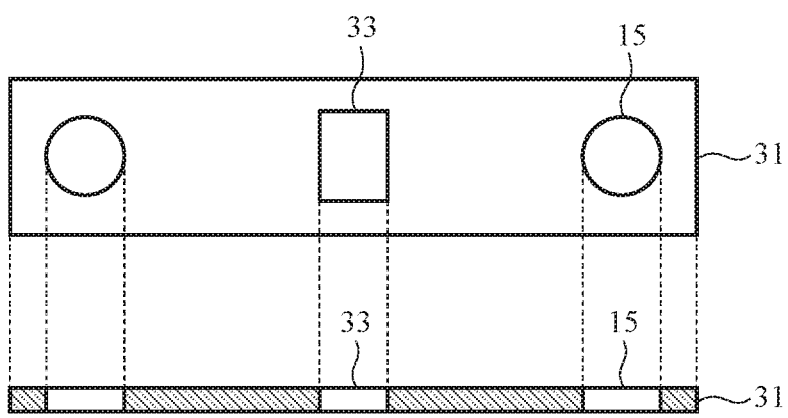

As shown in FIG. 2B, the bolt holes 15 for screwing and a hole portion 33 adapted to have a resistive material embedded therein are formed in the electrode material 31 using a method such as pressing, cutting, or laser machining. Specifically, a single hole portion 33 is provided at a substantially central position of the electrode material 31, and a pair of bolt holes 15 are provided at positions close to the ends of the electrode material 31 in the length direction.

Figure 3C:
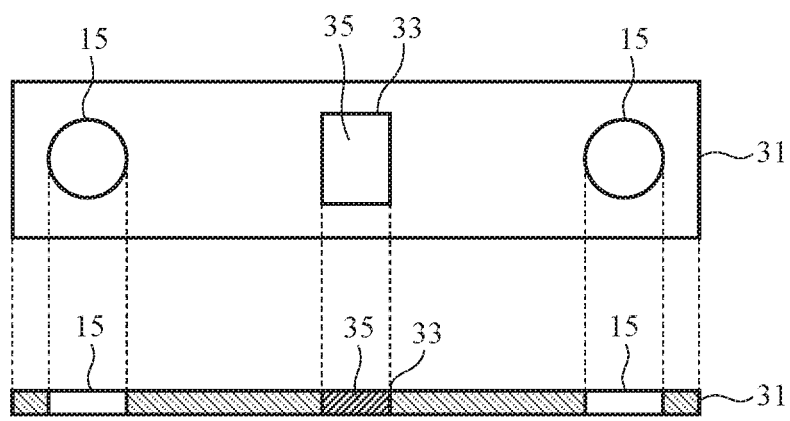
FIGS. 3C and 3D are views continued from FIGS. 2A and 2B.

As shown in FIG. 3C, a resistive material 35 prepared in advance, which has substantially the same size as the hole portion 33 and has higher resistance than the electrode material 31, is embedded in the hole portion 33. Therefore, the outer side face of the resistive material 35 abuts the inner side face of the hole portion 33 so that joined portions in a rectangular shape are formed, for example.

For both the electrode material 31 and the resistive material 35, long materials (plates) that have been cut out can be used, for example.

As the resistive material 35, a metal plate material such as a Cu—Ni, Cu—Mn, or Ni—Cr-based material can be used.

Figure 3D:
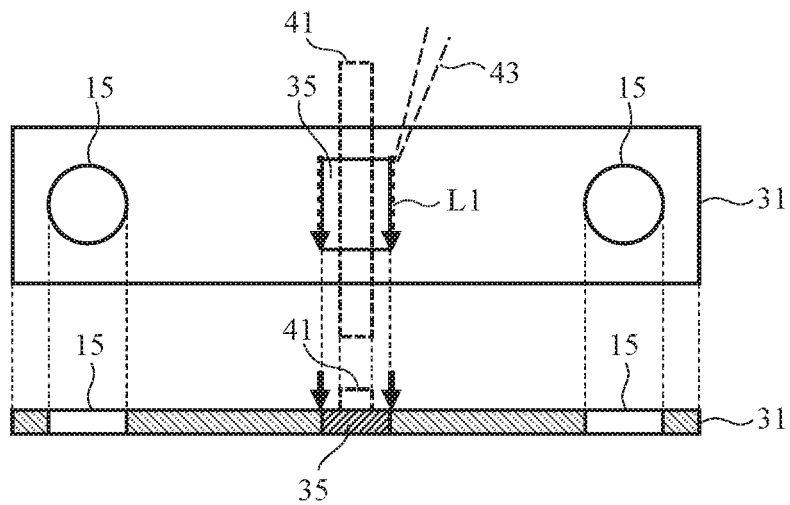

As shown in FIG. 3D, the resistive material 35 is fixed in the electrode material 31 using a pressing jig 41 or the like, and is scanned with an electron beam or a laser beam 43, for example, as indicated by reference numeral L1 so that the joined portions of the electrode material 31 and the resistive material 35 are welded together and a joined base material can thus be formed that has the electrode material 31 and the resistive material 35 embedded in and joined to the central region of the electrode material 31.

Since the through-hole (hole portion 33) is provided in the electrode material 31, and the resistive material 35 is embedded in the through-hole, distortion of the electrode material 31 (workpiece) can be suppressed even when welding is performed with an electron beam or the like. Further, when the pressing jig 41 is used, distortion of the workpiece can be suppressed more, which is advantageous.

Figure 4E:
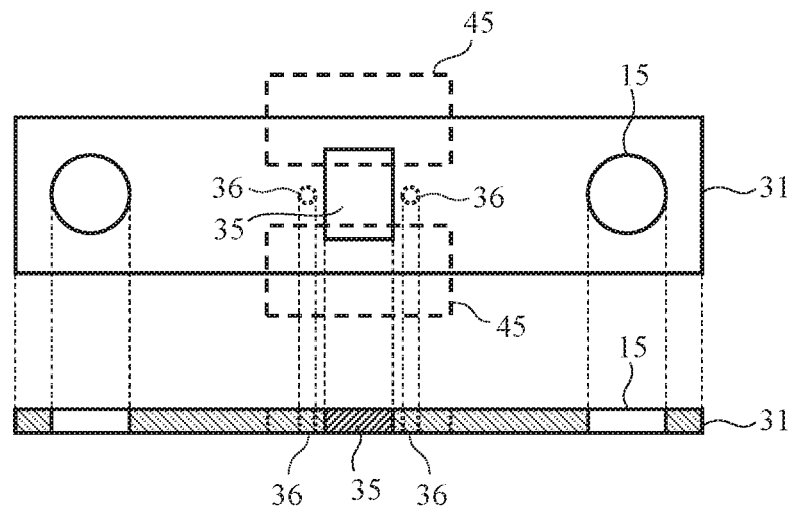
FIGS. 4E through 4G are views continued from FIGS. 3C and 3D.
Figure 4F:
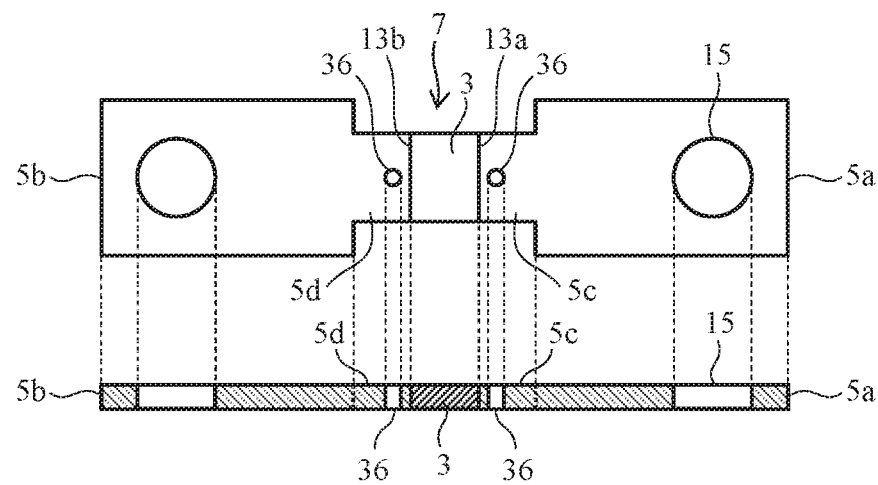

As shown in FIG. 4E, in order to determine the resistance value, press working (45) for determining the width of the resistive material 35 is performed, for example. Herein, regions including the ends of the resistive material 35 in the width direction are cut off to form the recess portions 7 (FIG. 4F). Then, as the resistive material 35 embedded is partially cut off from side faces thereof with respect to the initial width, the width of the resistive element becomes smaller and the resistance value can thus be adjusted. Further, if the start point and the end point of welding are cut off, variations in joining of the joined portions 13a, 13b can also be suppressed and stress can thus be relaxed.

Further, through-holes 36 adapted to have voltage sensing terminals provided therein are also formed in this step. Therefore, since the positional relationship of the voltage sensing terminals is stabilized, and since the step of adjusting the resistance value and the step of positioning the voltage sensing terminals are performed in the same step, high-accuracy current sensing with small variations in the relationship with the resistance value is possible.

Figure 4G:
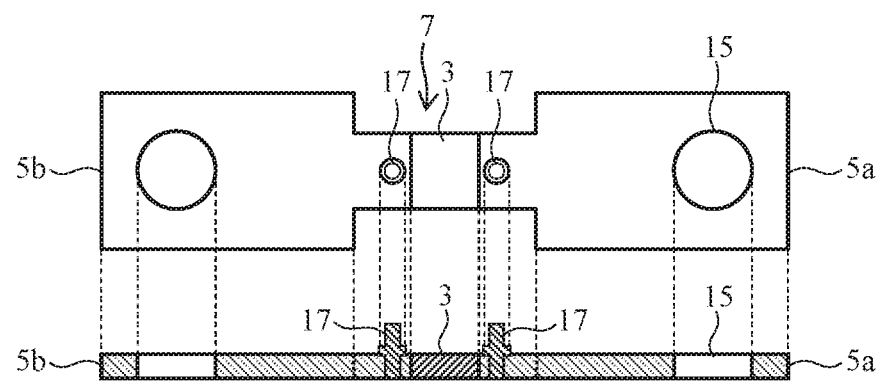

As shown in FIG. 4G, voltage sensing terminals 17 are formed. For example, bar-like terminals are inserted into and disposed in an upright position in the through-holes 36 of the narrow electrode portions 5c, 5d.

Through the aforementioned production steps, a current sensing device that uses the resistor shown in FIG. 1 can be produced.

It should be noted that as the material of the voltage sensing terminals 17, copper, brass, phosphor bronze, or copper alloy such as Corson alloy is preferably used.

It should be noted that when electron beam welding or the like is performed as shown in FIG. 3D, there is a possibility that the joined state at the start point and the end point of the joined portion may become unstable and such portion can become the origin of breakage. Herein, if cutting is performed at a portion including the start point and the end point as shown in FIG. 4E, it is possible to maintain the excellent joined state in addition to obtaining the aforementioned stress relaxation effect.

Figure 5:
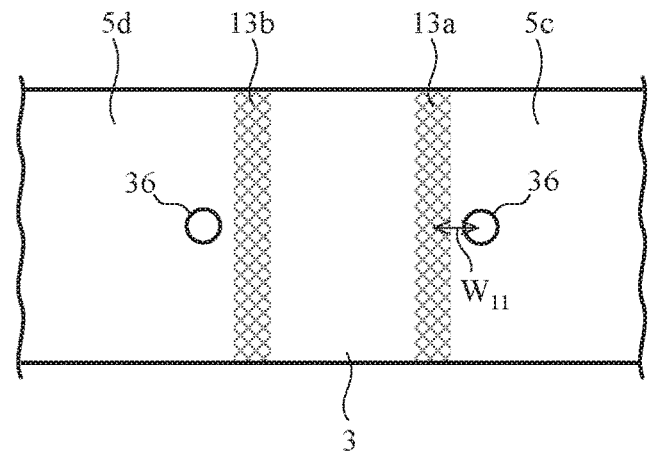
FIG. 5 is a view showing the positional relationship between a joined portion of a resistive element and an electrode terminal and a through-hole.

In addition, as shown in FIG. 5, the through-holes 36 are formed to have a positional relationship with the joined portions 13a, 13b of the resistive element 3 and the electrode terminals 5c, 5d such that the through-holes 36 are away from the joined portions 13a, 13b by $W_{11}$. That is, since the joined portions 13a, 13b have been alloyed through electron beam welding or the like, the joined portions 13a, 13b are difficult to be machined for forming the through-holes 36. Therefore, if through-holes are formed in regions excluding the alloyed regions, the through-holes 36 can be formed with high accuracy.

As described above, the production method in this embodiment is advantageous in that the positional accuracy of the voltage sensing terminals in the current sensing device can be maintained high.

(Third Embodiment)

Next, a current sensing device with a code display portion in accordance with a third embodiment of the present invention will be described. The code display portion 12 shown in FIG. 1 contains the following data, for example. That is, the code contains data such as a lot number, product name, value indicating characteristics (e.g., resistance value and TCR value), materials used (e.g., resistive material), producer, production site, production date, and user information (e.g., company that provides the product). In particular, if a code of data such as a combination of a lot number and a resistance value or data obtained by adding a TCR value thereto is displayed on a resistor after the resistor is produced, a user is able to know correct data and the like without actually measuring the resistance value, for example, which is very convenient. The value indicating characteristics is preferably the actually measured value, but may also be the design value. For example, the actually measured value may be recorded for the resistance value and the design value may be recorded for the TCR value.

FIGS. 6 to 9 are views for illustrating a current sensing device with a code display portion in accordance with this embodiment and a production method therefor.

Figure 9:
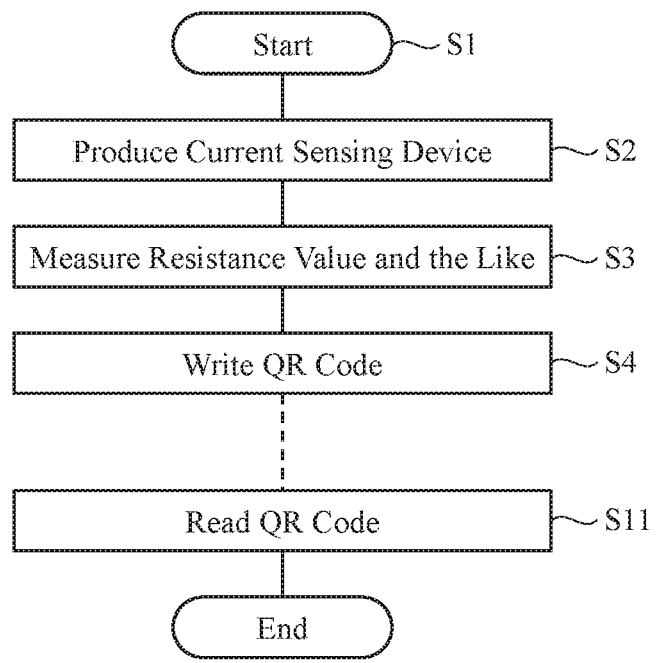
FIG. 9 is a flowchart showing an exemplary process flow in accordance with a third embodiment.

As shown in FIG. 9, a process is started (step S1: Start), and in step S2, a current sensing device that uses a resistor is produced as described in the first and second embodiments (see FIG. 1).

Figure 6A:
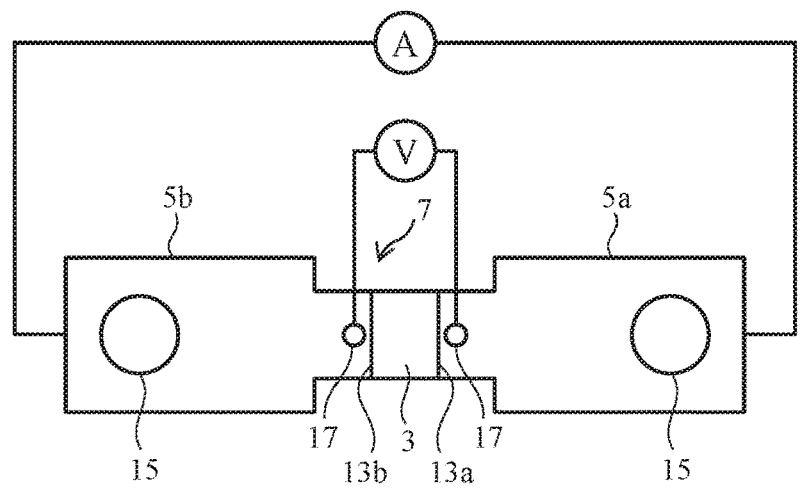
FIG. 6A shows a view in which the resistance value of a completed resistor is measured using a four-terminal measurement method.

Next, in step S3, the resistance value and the like of the resistor are measured. FIG. 6A is a view in which the resistance value of the completed resistor is measured with a four-terminal measurement method. The resistance value of the resistor is actually measured with a four-terminal measurement method using the voltage sensing terminals 17, 17 and the electrodes 5a, 5b. Besides, data that is necessary (e.g., TCR value) may also be measured.

Figure 6B:
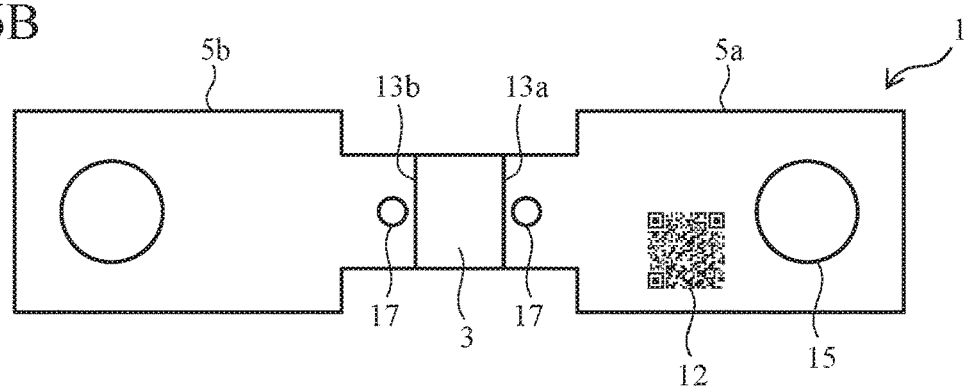
FIG. 6B shows a view in which a display portion, which has been obtained by encoding data such as a measured resistance value into a QR code or the like, is written onto the surface of an electrode of a current sensing device.

Next, in step S4, as shown in FIG. 6B, the display portion 12, which has been obtained by encoding data such as the measured resistance value into a QR code or the like, is written onto the surface of the electrode 5a of the current sensing device, for example. That is, information such as a characteristic value is encoded and printed onto the electrode.

For the printing method herein, fiber laser, semiconductor laser, green laser, electron beam, Yag laser, printing (inkjet printing), or the like can be used. In addition, as a print pattern, a QR code (registered trademark), data matrix, barcode, a two-dimensional code, or the like can be used.

The print place (position) is preferably the copper electrode portion 5a or 5b. It should be noted that printing on the resistive element 3 is preferably avoided considering the influence on the characteristics of the resistor.

Examples of printing on the copper electrode include a method of shaving a part of the surface through laser marking or coloring a part of the surface in black through carbonization.

A user or the like who is provided with the current sensing device that uses the resistor reads data on the QR code using a smartphone or a dedicated decoding device, for example (step S11) so that the process terminates.

With the aforementioned technique, a user or the like of the resistor is able to manage and check the resistance value only by reading a code of the display portion 12 through a code reader or the like and without the need to possess a system for measuring the resistance value. Therefore, traceability based on digital data is possible. Problems such as erroneous mounting can also be avoided.

Figure 7:
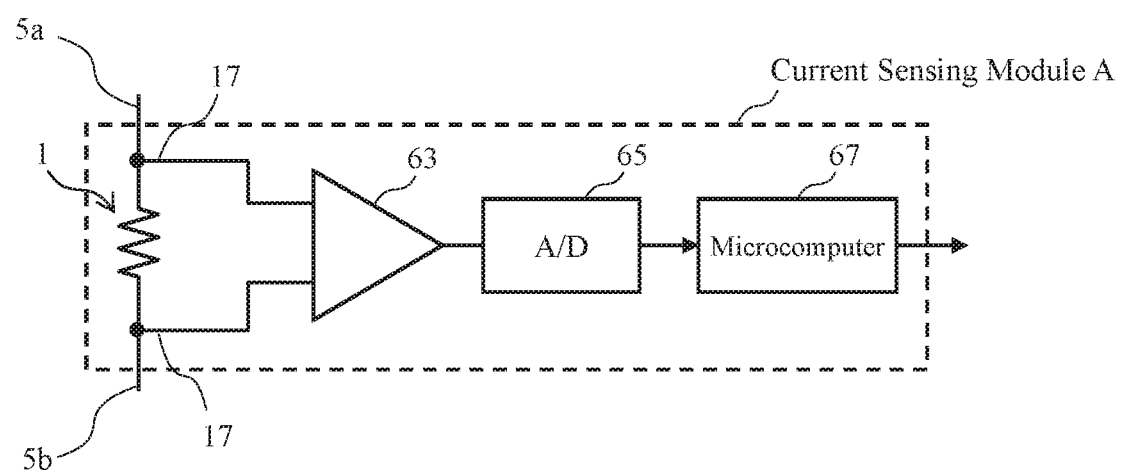
FIG. 7 is a view showing an exemplary circuit configuration of a current sensing module.
Figure 8A:
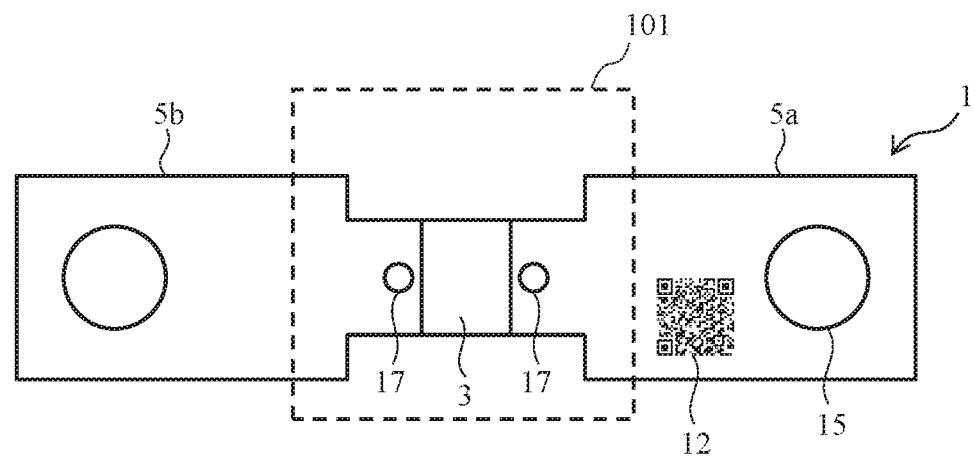
FIG. 8A is a view showing an exemplary configuration of the external appearance of a current sensing module.
Figure 8B:
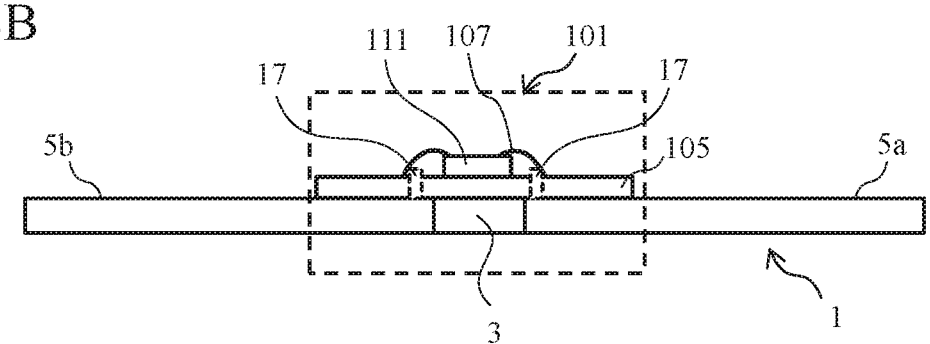
FIG. 8B is a cross-sectional view showing an exemplary configuration of the current sensing module.
Figure 8C:
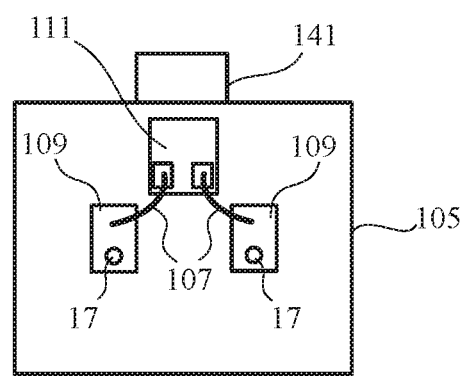
FIG. 8C is a plan view showing an exemplary configuration of the current sensing module.

Next, an exemplary configuration of the current sensing module will be described. FIG. 7 is a view showing an exemplary circuit configuration of the current sensing module. FIG. 8A is a view showing an exemplary configuration of the external appearance of the current sensing module. FIG. 8B is a cross-sectional view showing an exemplary configuration of the current sensing module. FIG. 8C is a plan view showing an exemplary configuration of the current sensing module.

The current sensing module A shown in FIG. 7 includes the aforementioned resistor 1, an amplifier 63 that amplifies a voltage signal across the opposite terminals of the resistor 1, an A/D converter 65 that A/D converts a signal amplified by the amplifier 63, and a microcomputer 67 that performs computation upon receiving a digital signal output.

When current flows through the current sensing device 1, a voltage level acquired by the voltage sensing terminals 17 of the current sensing device 1 is amplified and converted into digital data so that a current value is computed by the microcomputer 67. The current value is sent to a variety of electrical appliances via a data bus and the like.

As the circuit shown in FIG. 7, a variety of elements are mounted on a detection circuit portion 101 as shown in FIGS. 8A to 8C and are connected to the current sensing device so that the module is formed. The detection circuit portion 101 is sheathed through molding as appropriate. The code display portion 12 is preferably disposed at a position where it is not shielded by the detection circuit portion 101 or the mold. As shown in FIG. 8B, a PCB 105 is mounted on the current sensing device 1 and is molded or encapsulated in a case as appropriate so that the current sensing module A is formed. The voltage sensing terminals 17 penetrate to the front surface side from the rear surface side of the PCB 105. The PCB 105 and the current sensing device 1 are screwed via the through-holes indicated by reference numeral 11 in FIG. 1. The PCB 105 is preferably formed of a thermally conductive, electrically insulating material so that heat generated from the resistor is detected. The PCB 105 has a semiconductor chip 111 and the like mounted thereon.

FIG. 8C is a plan view of the portion of the PCB 105. The voltage sensing terminals 17 exposed on the front surface side of the PCB 105 are solder-connected to contacts 109 formed on the PCB 105. The contacts 109 and the semiconductor chip 111 are connected together by wires 107. The semiconductor chip 111 incorporates the aforementioned amplifier, A/D converter, and microcomputer. The semiconductor chip 111 connects with a connector 141 so that a current value can be output.

To incorporate such a current sensing device 1 in the current sensing module A, the code display portion 12 of the current sensing device 1 is read so that specific information such as the resistance value and TCR value is recorded on ROM in the microcomputer 67. Since a CPU in the microcomputer 67 computes the current value using such information, higher-accuracy current detection is possible. In addition, it is also possible to measure the temperature of or around the current sensing device 1 using a temperature sensor (not shown) and compute the current value by using the TCR value and applying necessary correction thereto.

(Fourth Embodiment)

Next, a method for producing a current sensing device that uses a resistor in accordance with a fourth embodiment of the present invention will be described. As an example of a current sensing device that uses a resistor to be produced, the structure shown in FIG. 1 is used.

FIGS. 10 and 11 are views each showing a method for producing a resistor in accordance with this embodiment, and showing a plan view and a cross-sectional view in pairs.

Figure 10A:
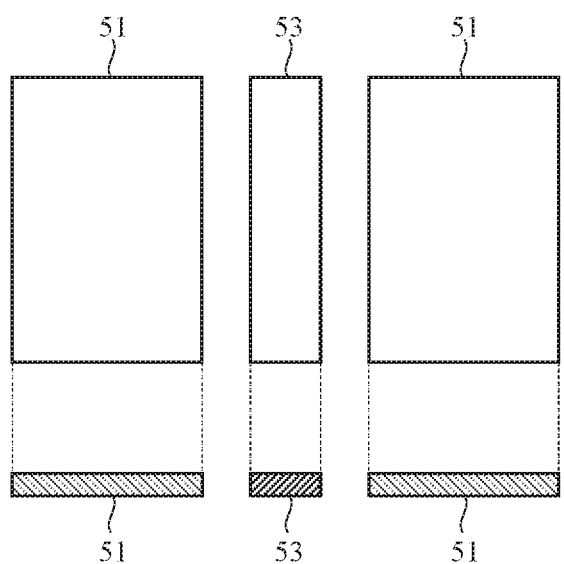
FIGS. 10A through 10C are views showing a method for producing a resistor in accordance with a fourth embodiment of the present invention, and showing a plan view and a cross-sectional view in pairs.

As shown in FIG. 10A, for example, a resistive material 53 in a long flat-plate shape or the like, and first and second electrode materials 51, each of which is made of an electrode material with higher electrical conductivity than that of the resistive material 53 and is in a long flat-plate shape like the resistive material 53, are prepared.

Figure 10B:
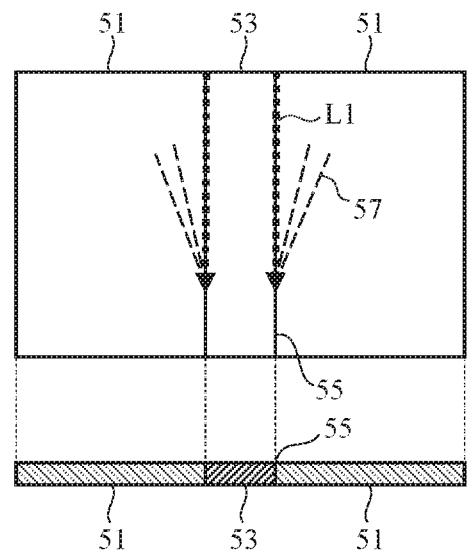

As shown in FIG. 10B, opposite end faces of the resistive material 53 and end faces of the first and second electrode materials 51 are arranged such that they contact each other and from joined portions. Then, the joined portions 55 are welded together with an electron beam or a laser beam 57, for example, as indicated by reference numeral L1 so that a single flat plate is formed. Various adjustments such as adjustments of the resistance value and shape can also be performed through adjustment of the joined positions.

Figure 10C:
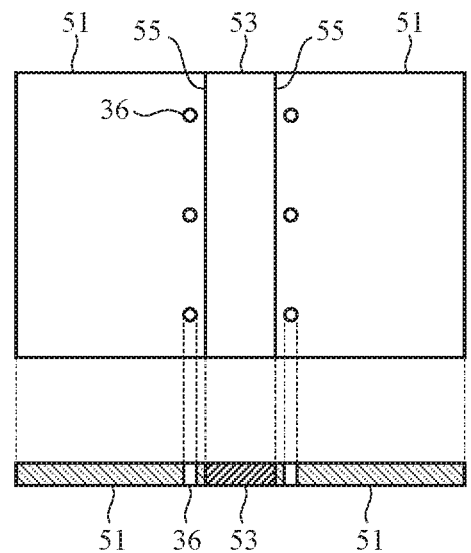

As shown in FIG. 10C, a plurality of through-holes 36 are formed in the first and second electrode materials 51 around the joined portions 55 along the joined portions 55.

Figure 11D:
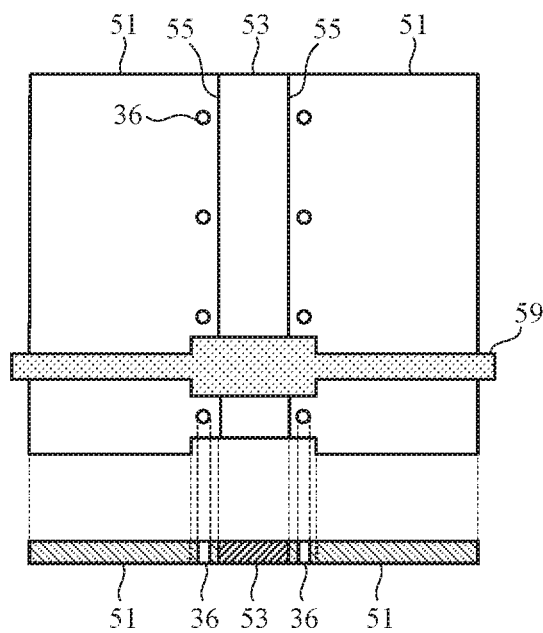
FIGS. 11D through 11F are views continued from FIGS. 10A through 10C.
Figure 11E:
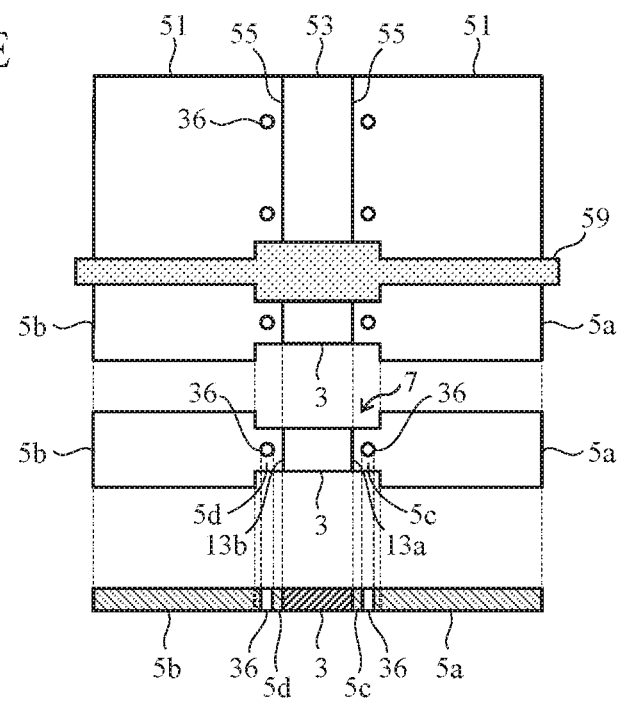

As shown in FIG. 11D, the resistor material (joined base material) including the joined portions 55 is cut using a die 59 that extends in the length direction and is wider in a region including the resistive material 53 and the electrode materials 51 around the resistive material 53. As shown in FIG. 11E, the joined portions after the cutting are indicated by reference numerals 13a, 13b.

Figure 11F:
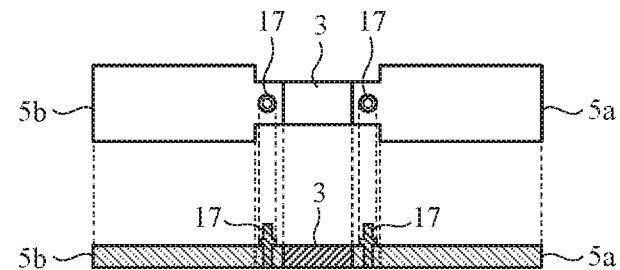

As shown in FIG. 11E, a resistor that has recess portions 7 as in the first embodiment and has through-holes 36 in the narrow electrode portions 5c, 5d can be formed. Next, as shown in FIG. 11F, bar-like metal is inserted in the through-holes 36 so that voltage sensing terminals 17 are formed.

Through the aforementioned steps, a number of current sensing devices each having the main electrode portions 5a, 5b and the narrow electrode portions 5c, 5d as well as the voltage sensing terminals 17 can be produced.

It should be noted that the bolt holes 15, the holes 11 for fixing a current sensing substrate, and the like shown in FIG. 1 are omitted herein, but such holes may be either provided or not (which will also be omitted in the following description).

(Fifth Embodiment)

Next, a method for producing a current sensing device that uses a resistor in accordance with a fifth embodiment of the present invention will be described. As an example of a current sensing device that uses a resistor to be produced, the structure shown in FIG. 1 is used.

FIGS. 12 and 13 are views showing a method for producing a resistor in accordance with this embodiment, and showing a plan view and a cross-sectional view in pairs.

Figure 12A:
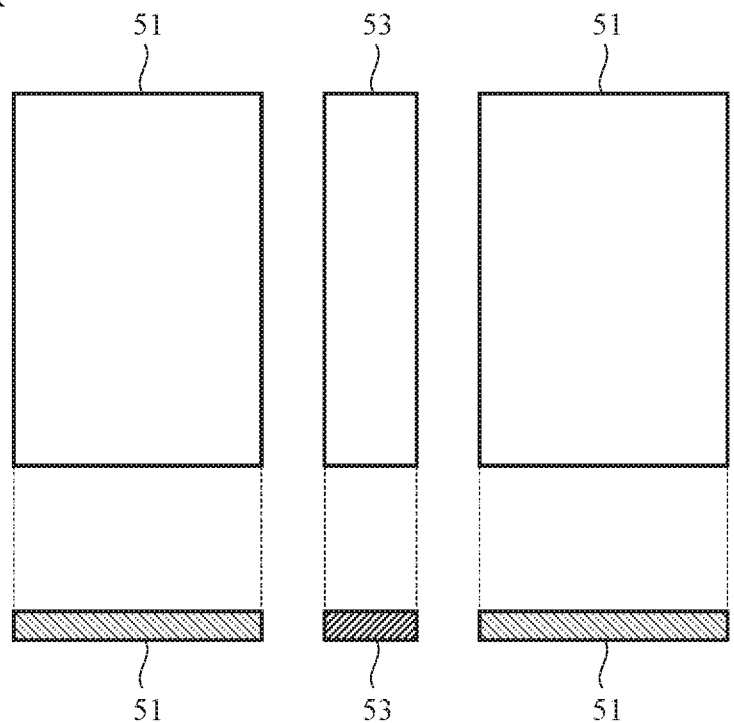
FIGS. 12A and 12B are views showing a method for producing a resistor in accordance with a fifth embodiment of the present invention, and showing a plan view and a cross-sectional view in pairs.
Figure 12B:
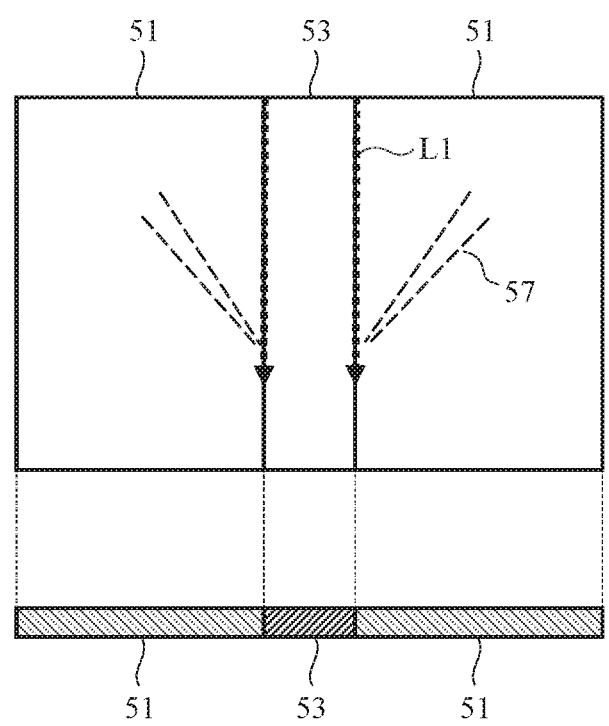

The steps of forming the resistive material (joined base material) shown in FIGS. 12A and 12B are similar to those shown in FIGS. 10A and B.

Figure 13C:
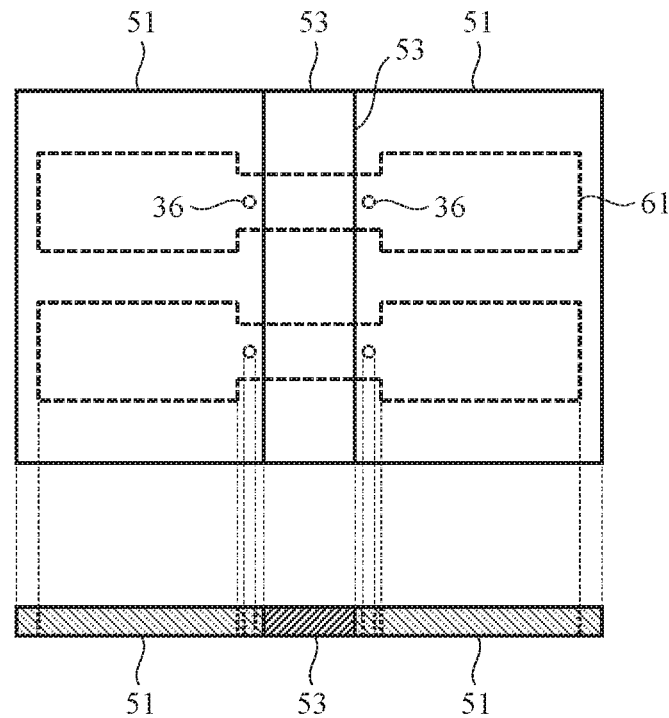
FIGS. 13C through 13E are views continued from FIGS. 12A and 12B.

As shown in FIG. 13C, the joined base material is stamped using a die 61 with a shape as indicated by the dashed line, that is, a shape that conforms to the shape of a resistor having recess portions in the length direction. In the stamping step, a plurality of through-holes 36 are formed in the first and second electrode materials 51 around the joined portions 53 along the joined portions 53. In such a case, a number of resistors may be stamped out in a single step.

Figure 13D:
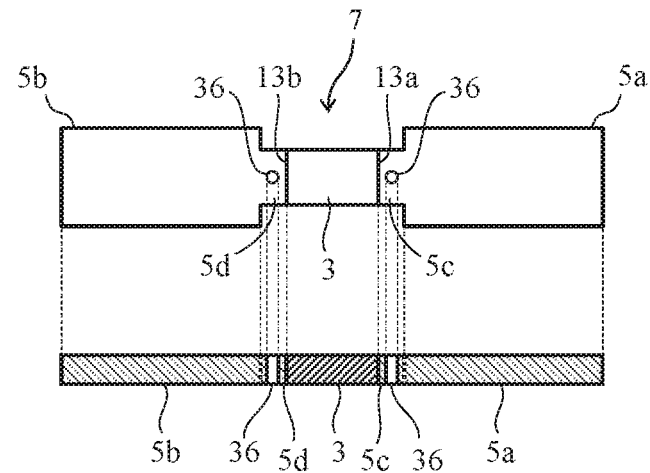

As shown in FIG. 13D, a resistor having the recess portions 7 in a region including the joined portions 13a, 13b of the split member can be formed. Therefore, advantageous effects similar to those in the first to third embodiments can be obtained.

Figure 13E:
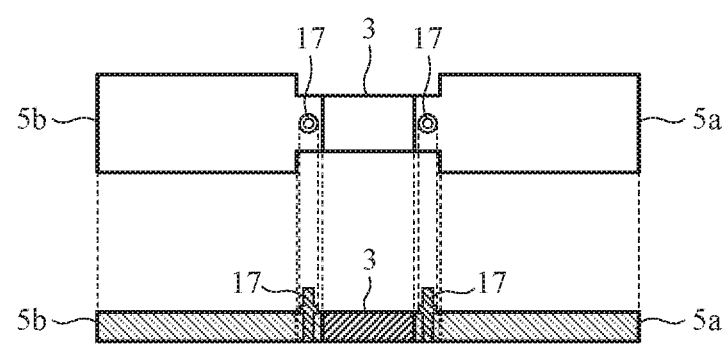

As shown in FIG. 13E, voltage sensing terminals 17 are formed on the narrow electrode portions 5c, 5d, respectively.

Through the aforementioned steps, a number of resistors such as the one shown in FIG. 1 that includes main electrode portions and narrow electrode portions can be produced.

According to this embodiment, the step of determining the width of a resistive element and the step of forming through-holes in which voltage sensing terminals are adapted to be disposed in an upright position can be performed concurrently. Therefore, advantageous effects are obtained in that the steps can be simplified and the positioning accuracy is improved.

(Sixth Embodiment)

Next, a method for producing a current sensing device that uses a resistor in accordance with a sixth embodiment of the present invention will be described. As an example of a current sensing device that uses a resistor to be produced, the structure shown in FIG. 1 is used. However, the joined portions of the electrodes and the resistive element are not formed herein.

FIG. 14 are views showing a method for producing a resistor in accordance with this embodiment, and showing a plan view and a cross-sectional view in pairs.

Figure 14A:
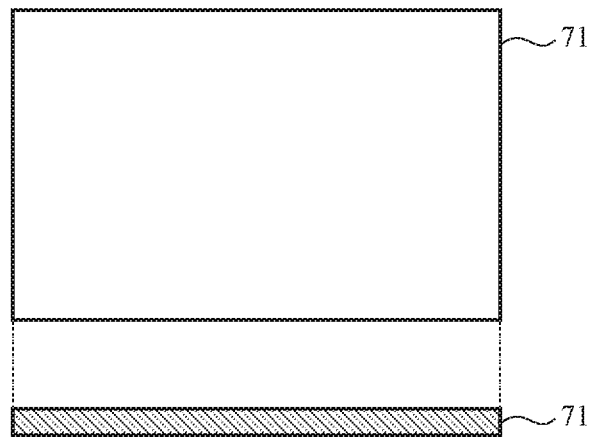
FIGS. 14A through 14D are views showing a method for producing a resistor in accordance with a sixth embodiment of the present invention, and showing a plan view and a cross-sectional view in pairs.

As shown in FIG. 14A, a resistive material 71 is prepared. The resistive material 71 is a single metal plate material, such as Cu, for example. It should be noted that the resistive material 71 is also referred to as an electrical conductor.

Figure 14B:
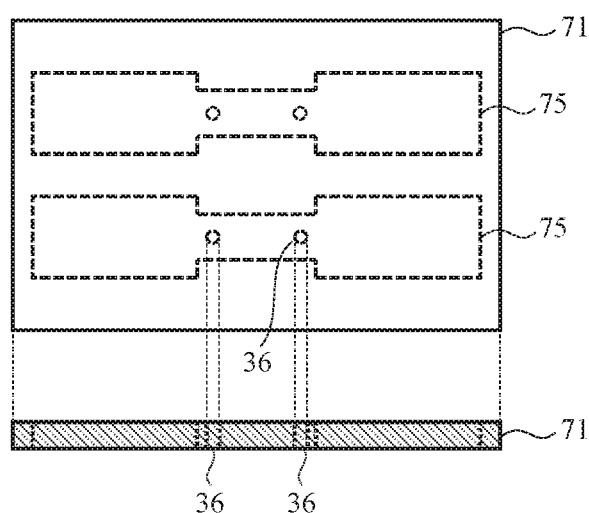

As shown in FIG. 14B, the resistive material 71 is stamped using a die 75 with a shape as indicated by the dashed line, that is, a shape that conforms to the shape of a resistor having recess portions in the length direction. During the stamping step, a plurality of through-holes 36 are also formed in the resistive material 71. In such a case, a number of resistors may also be stamped out through a single step.

Figure 14C:
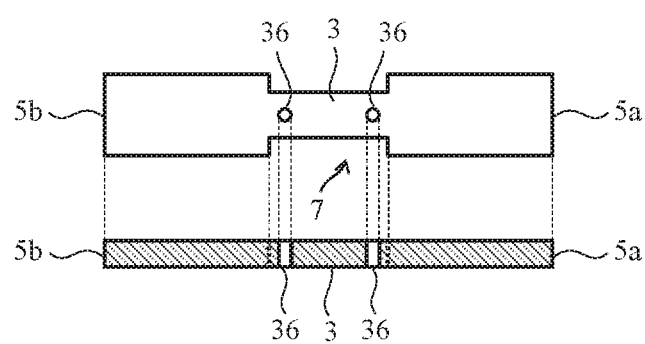

As shown in FIG. 14C, a resistor with the recess portions 7 and the through-holes 36 is formed.

Figure 14D:
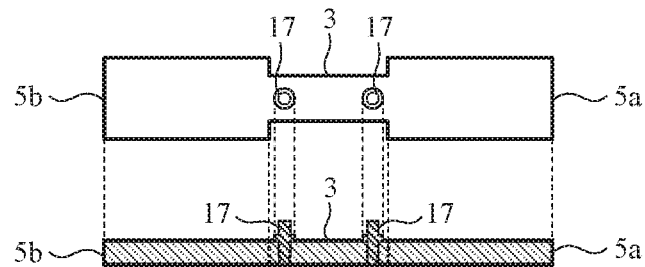

As shown in FIG. 14D, voltage sensing terminals 17 are formed in the through-holes 36, 36, which are formed in the region having the recess portions 7 formed thereon, respectively.

Through the aforementioned steps, a number of current sensing elements that use resistors can be produced using only a resistive material.

According to this embodiment, the step of determining the width of a resistive element and the step of forming through-holes in which voltage sensing terminals are adapted to be disposed in an upright position can be performed concurrently. Therefore, advantageous effects are obtained in that the steps can be simplified and the positioning accuracy is improved.

(Seventh Embodiment)

Next, a seventh embodiment of the present invention will be described. In this embodiment, a terminal structure for providing voltage sensing terminals in an upright position on a resistor and a production method therefor will be described.

(1) Terminal Structure 1

Figure 15A:
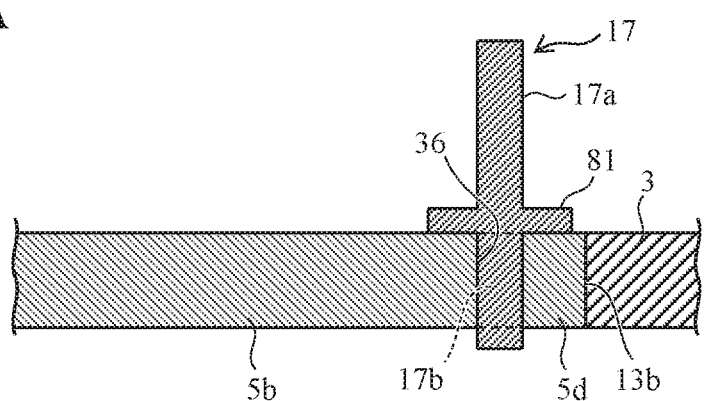
FIGS. 15A and 15B are views showing examples of terminal structures.

FIG. 15A is a cross-sectional view showing an exemplary configuration of the terminal structure. In the structure shown in FIG. 15A, the voltage sensing terminal 17 is provided in the through-hole 36 formed in the electrode 5b (5d). In the structure, a flange 81 is formed at an intermediate portion of the voltage sensing terminal 17. When the voltage sensing terminal 17 is inserted in the through-hole 36, the insertion position of the voltage sensing terminal 17 is determined by the flange 81, and the inserted structure is also stabilized. The voltage sensing terminal 17 has a first terminal portion 17b that is stored in the through-hole 36 and a second terminal portion 17a that protrudes beyond the through-hole 36.

It should be noted that the voltage sensing terminal 17 is preferably pressed into the through-hole 36 but may also be welded to the through-hole 36.

(2) Terminal Structure 2

Figure 15B:
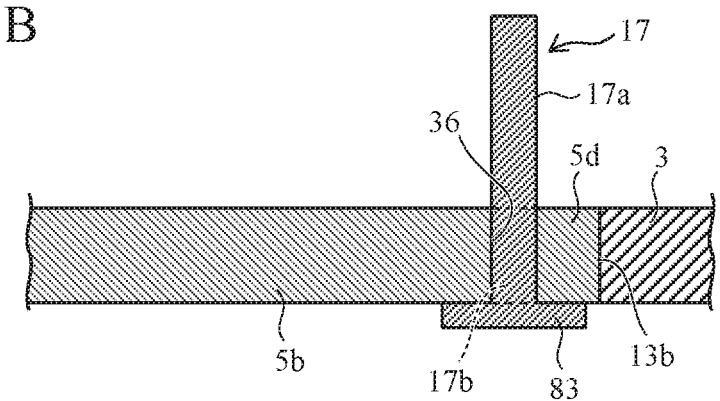

FIG. 15B is a cross-sectional view showing an exemplary configuration of a terminal structure 2. In the structure shown in FIG. 15B, the voltage sensing terminal 17 is provided in the through-hole 36 formed in the electrode 5b (5d). In the structure, a flange 83 is formed at one end of the voltage sensing terminal 17. When the voltage sensing terminal 17 is inserted into the through-hole 36 from the lower side of the drawing, the insertion position of the voltage sensing terminal 17 is determined by the flange 83, and the inserted structure is also stabilized. The voltage sensing terminal 17 includes a first terminal portion 17b that is stored in the through-hole 36 and a second terminal portion 17a that protrudes beyond the through-hole 36. This is the same hereinafter.

It should be noted that the voltage sensing terminal 17 is preferably pressed into the through-hole 36 but may also be welded to the through-hole 36.

(3) Terminal Structure 3

Figure 16A:
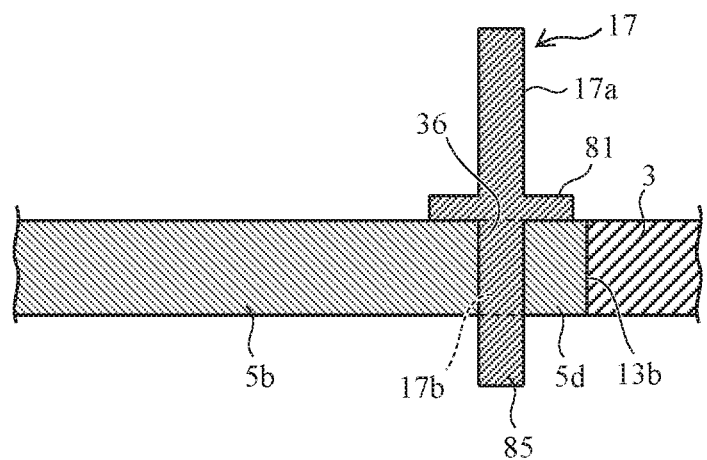
FIGS. 16A and 16B are views showing examples of terminal structures.

FIG. 16A is a cross-sectional view showing an exemplary configuration of a terminal structure 3. The structure shown in FIG. 16A is similar to the terminal structure 1, but is a structure whose side inserted through the through-hole 36 has a protruding portion 85 that protrudes to the rear side.

(4) Terminal Structure 4

Figure 16B:
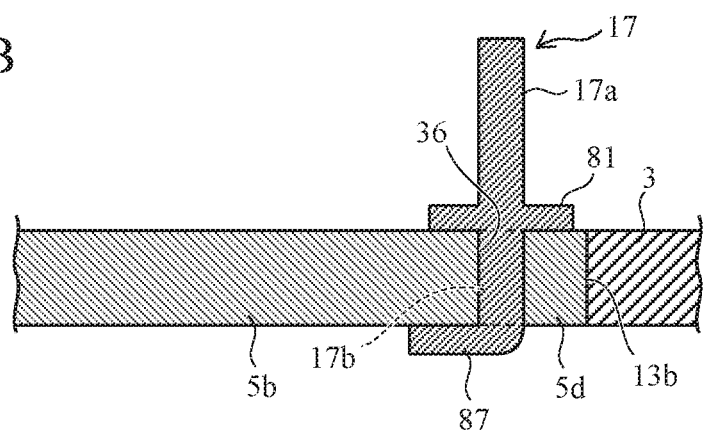

FIG. 16B is a cross-sectional view showing an exemplary configuration of a terminal structure 4. In the structure shown in FIG. 16B, the protruding portion 85, which is a side of the terminal structure 3 inserted through the through-hole 36 and protruding to the rear side, is bent to form a bent portion 87 that abuts the rear surface of the electrode 5b, so that the structure is fixed on the rear surface of the electrode 5b. Further, the bent portion 87 may be welded to the rear surface of the electrode 5b.

(5) Terminal Structure 5

Figure 17A:
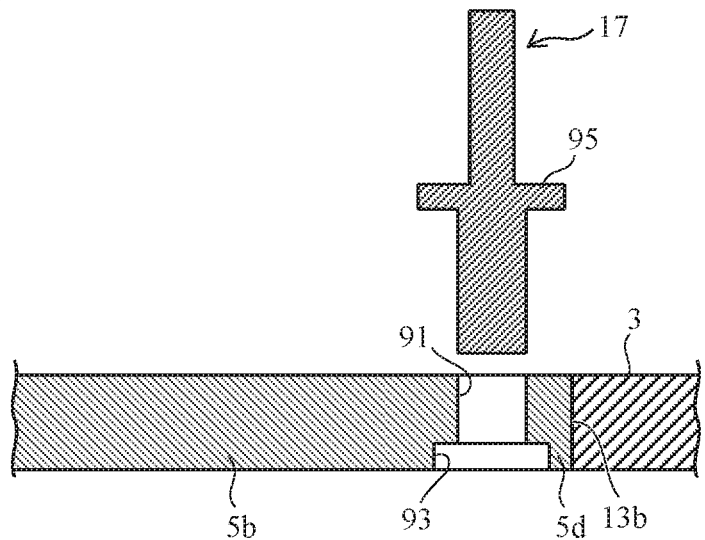
FIGS. 17A through 17C are views showing an example of a terminal structure.

FIG. 17 are views showing an exemplary configuration of a terminal structure 5 and a production method therefor. As shown in FIG. 17A, a flange 95 is provided at an intermediate portion of the voltage sensing terminal 17, and a portion below the flange 95 is formed thicker than a portion above the flange 95 (terminal side). Meanwhile, the through-hole (36) formed in the narrow electrode portion 5d on the electrode 5b side is formed such that the diameter of a lower portion is larger than that of an upper portion. That is, the through-hole 36 is formed such that an upper through-hole 91 communicates with a lower through-hole 93 (a recess portion with an increased inner diameter) so that a recess portion at an opening of the through-hole 36 is formed.

Figure 17B:
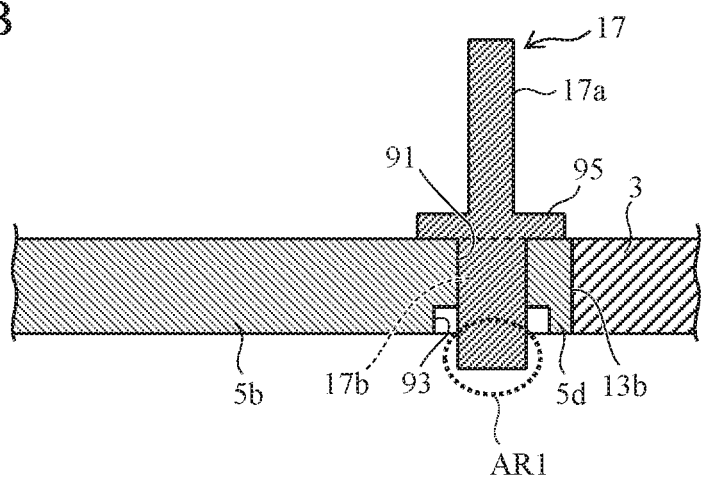

As shown in FIG. 17B, when the voltage sensing terminal 17 is inserted into the through-hole 36 from above, the lower surface of the flange 95 abuts the surface of the electrode 5b (5d).

Figure 17C:
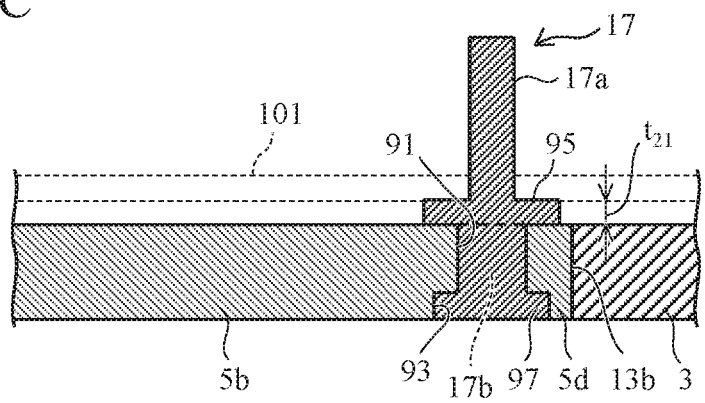

As shown in FIG. 17C, a portion AR1 below the flange 95 is squashed so that the portion AR1 below the flange 95 deforms to fit within the lower through-hole 93, thereby filling the space with a large diameter so as to form a flange 97.

According to such a structure, the flange 95 and the flange 97 prevent the voltage sensing terminal 17 from being easily disengaged from the current sensing device 1, and thus allow the voltage sensing terminal 17 to be more firmly fixed on the current sensing device 1.

In addition, as shown in FIG. 17C, this structure is convenient since the flange 95 can be used as a spacer (with a thickness of $t_{21}$) when the PCB 101 is mounted on the current sensing device 1.

(6) Terminal Structure 6

Figure 18:
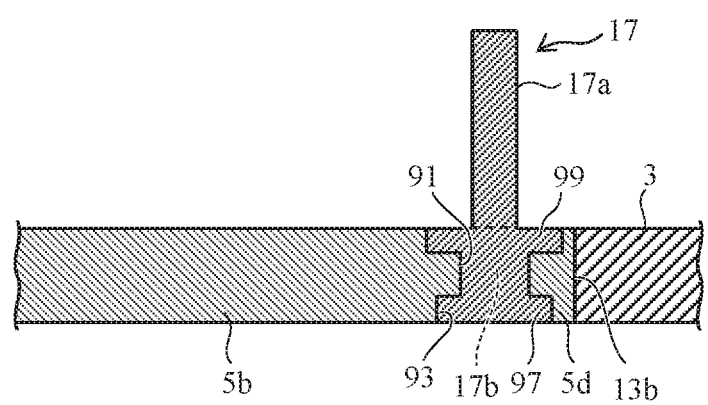
FIG. 18 is a view showing an example of a terminal structure.

FIG. 18 is a view showing an exemplary configuration of a terminal structure 6. The structure shown in FIG. 18 is obtained by forming recess portions at upper and lower openings of a through-hole. Such a structure can be formed by, in the structure shown in FIG. 17, fitting the voltage sensing terminal into the upper recess portion and hammering the voltage sensing terminal into the lower recess portion. According to such a structure, an upper flange 99 and a lower flange 97 become approximately flush with the upper and lower surfaces of the electrode 5b (5d), respectively. Therefore, there is an advantage in that the protrusions and recesses do not interrupt.

In the aforementioned embodiments, the configurations and the like shown in the attached drawings are not limited thereto and can be changed as appropriate within the range that the advantageous effects of the present invention are exerted. Further, the configurations and the like can be changed as appropriate within the scope of the object of the present invention.

The configurations of the present invention can be freely selected, and an invention that includes the selected configurations is also included in the present invention.

INDUSTRIAL APPLICABILITY

The present invention is applicable to current sensing devices.

All publications, patents, and patent applications that are cited in this specification are all incorporated by reference into this specification.

What is claimed is:

1. A current sensing device comprising:
   a resistive element having first and second opposite end surfaces and designed to have a specific resistance between the first and second opposite end surfaces;
   a pair of electrodes each having an electrical conductivity hi her than that of the resistive element, the pair of electrodes each having proximal and distal opposite end surfaces and electrically connected to the resistive element in such a manner that the proximal end surfaces of the pair of electrodes are in direct contact, respectively, with the first and second opposite end surfaces of the resistive element, wherein each of the pair of electrodes comprises a through-hole formed in the electrode adjacent to the proximal end surface; and
   a pair of voltage sensing terminals formed of a rod-like metal and inserted, respectively, in the through-holes of the electrodes to establish electrical connection with the pair of electrodes,
   wherein each of the pair of voltage sensing terminals comprises two parallel flanges arranged along a length of the voltage sensing terminal, the two parallel flanges tightly pressing the electrodes from opposite upper and lower surfaces of the electrode to secure the voltage sensing terminal to the electrode, and
   the voltage sensing terminal includes a first terminal portion located in the through-hole of the electrode between the two parallel flanges and a second terminal portion standing from the electrode.

2. The current sensing device according to claim 1, wherein at least one of the opposite upper and lower surfaces of the electrode is formed with a recess inclusive of the through-hole, and one of the two parallel flanges sits in the recess.

3. The current sensing device according to claim 1, wherein the current sensing device includes a section, between the pair of voltage sensing terminals, whose width is narrower than widths of any other sections of the current sensing device.

4. A method for producing a current sensing device, comprising:
   providing a resistive element having first and second opposite end surfaces and designed to have a specific resistance between the first and second opposite end surfaces;
   providing a pair of electrodes each having an electrical conductivity higher than that of the resistive element, the pair of electrodes each having proximal and distal opposite end surfaces and electrically connected to the resistive element in such a manner that the proximal end surfaces of the pair of electrodes are in direct contact, respectively, with the first and second opposite end surfaces of the resistive element;

machining the current sensing device to form a section of the current sensing device which includes the resistive element and whose width is narrower than widths of any other sections of the current sensing device;

forming a pair of through-holes, respectively, in the pair of electrodes adjacent to the proximal end surfaces; and inserting a pair of voltage sensing terminals, respectively, in the pair of through-holes, each of the pair of voltage sensing terminals being formed with a rod-like metal and comprising two parallel flanges arranged along a length of the voltage sensing terminal, the two parallel flanges tightly pressing the electrodes from upper and lower opposite surfaces of the electrode to secure the voltage sensing terminal upright to the electrode.

* * * * *

UNITED STATES PATENT AND TRADEMARK OFFICE
CERTIFICATE OF CORRECTION

PATENT NO. : 10,564,188 B2  
APPLICATION NO. : 15/739022  
DATED : February 18, 2020  
INVENTOR(S) : Kenji Kameko et al.

Page 1 of 1

It is certified that error appears in the above-identified patent and that said Letters Patent is hereby corrected as shown below:

In the Claims

In Column 12, Claim 1, Line 21, delete "hi her" and replace with --higher--.

Signed and Sealed this  
Fourteenth Day of July, 2020

Andrei Iancu  
*Director of the United States Patent and Trademark Office*